US008311789B2

(12) United States Patent
Eyvazzadeh et al.

(10) Patent No.: US 8,311,789 B2
(45) Date of Patent: Nov. 13, 2012

(54) MONTE CARLO SIMULATION OF WELL LOGGING DATA

(75) Inventors: Ramsin Yacood Eyvazzadeh, Dhahran (SA); Charles Bradford, Dhahran (SA); David Grahame Kersey, Dhahran (SA); Hilal Al-Waheed, Qatif (SA)

(73) Assignee: Saudi Arabian Oil Company, Dhahran (SA)

( * ) Notice: Subject to any disclaimer, the term of this patent is extended or adjusted under 35 U.S.C. 154(b) by 742 days.

(21) Appl. No.: 11/361,782

(22) Filed: Feb. 24, 2006

(65) Prior Publication Data
US 2007/0203681 A1 Aug. 30, 2007

(51) Int. Cl.
*G06G 7/48* (2006.01)
*G01V 3/00* (2006.01)
*G01N 15/08* (2006.01)

(52) U.S. Cl. .............. 703/10; 324/303; 73/38

(58) Field of Classification Search .......... 703/2, 6, 703/9, 10; 367/25, 27, 68–72, 73; 73/152.05, 73/38; 324/303
See application file for complete search history.

(56) References Cited

U.S. PATENT DOCUMENTS

| | | | | |
|---|---|---|---|---|
| 6,618,678 | B1* | 9/2003 | Van Riel | 702/14 |
| 2002/0147574 | A1* | 10/2002 | Ong et al. | 703/10 |
| 2004/0140801 | A1* | 7/2004 | Schoen et al. | 324/303 |
| 2005/0263691 | A1* | 12/2005 | Guo | 250/266 |

OTHER PUBLICATIONS

Kazuo Nakayama, "Estimation of Reservoir Properties by Monte Carlo Simulation," 2000, Society of Petroleum Engineers, Inc., pp. 1-8.*

Otis P. Armstrong, "Permeability Correlations for Carbonate & Other Rocks," 2003, GSA Meeting 2003 Seattle Wa., pp. 1-13.*

J.E. Walstrom et al., "Evaluating Uncertainty in Engineering Calculations", 1967, Society of Petroleum Engineers, pp. 1595-1603.*

Daniel Ferguson, et al.; "Application of Advanced Reservoir Characterization, Simulation, and Production Optimization Strategies to Maximize Recovery in SLope and Basin Clastic Reservoirs, West Texas (Delaware Basin)"; 1999; Bureau of Economic Geology, The University of Texas at Austin; pp. 1-6.*

Rebecca B. Latimer, et al.; "Integrated Seismic Reservoir Characterization and Modeling: A Guld of Mexico 3D Case History", 1996, GCSSEPM 1996 Research Conference, pp. 1-10.*

* cited by examiner

*Primary Examiner* — Kamini S Shah
*Assistant Examiner* — Juan Ochoa
(74) *Attorney, Agent, or Firm* — Abelman, Frayne & Schwab

(57) ABSTRACT

A system and method identify hydrocarbon productive reservoir zones using Monte Carlo numerical analysis to account for uncertainties in log measurements and petrophysical parameters. Random errors in logging tool responses and core measurements, as well as reservoir heterogeneity, are incorporated in a Monte Carlo simulation to output appropriate petrophysical models to calculate statistical distributions for saturation and permeability to define productive zones, non-productive zones and zones of undetermined productivity as a basis of deciding whether additional logging, core sampling or well test data are needed to reclassify the undetermined zones as either productive or non-productive. As uncertainties are quantified in the analysis, the degree of certainty in determining productive and non-productive zones is known and can be used to decide whether to further test, stimulate or abandon reservoir zones.

15 Claims, 16 Drawing Sheets

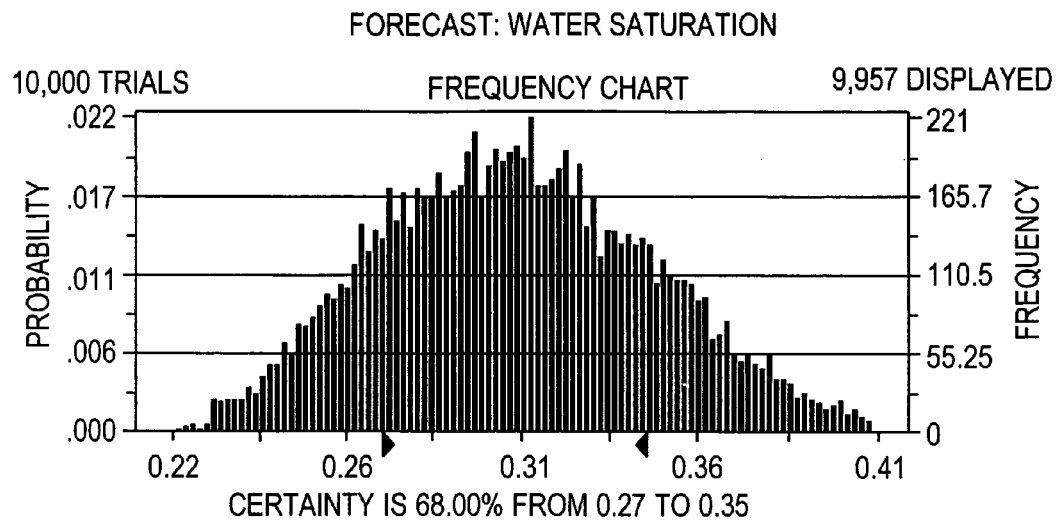
FIG. 5
FIG. 6
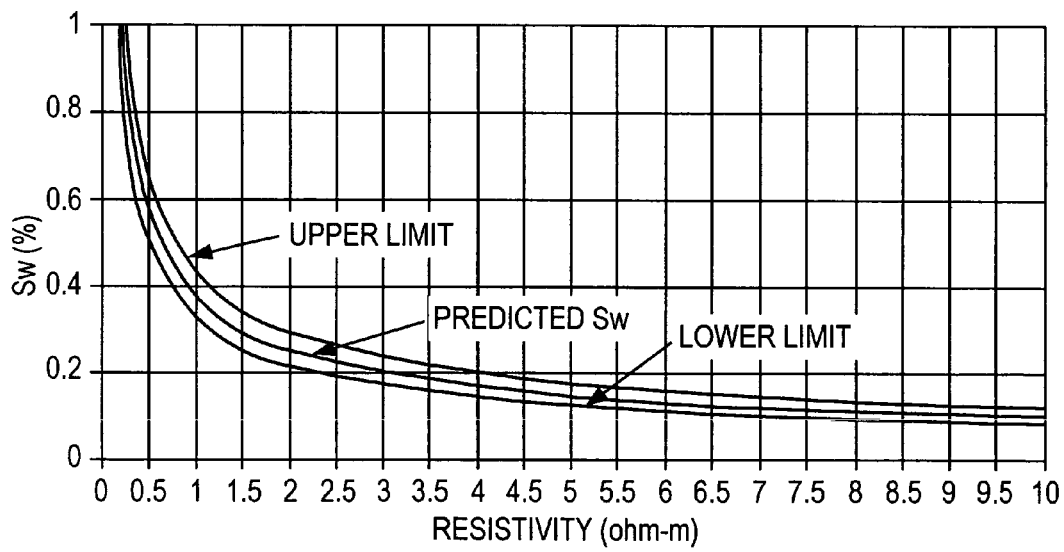
SATURATION UNCERTAINTY
MODELED VALUES
Rw = .012 ohm-m
M = 2 +/- 10% BOX DISTRIBUTION
N = 2 +/- 10% BOX DISTRUBUTION
Rt +/- 7% LOG NORMAL DISTRIBUTION
Ø = +/- 1 pu

MONTE CARLO SIMULATION OF WELL LOGGING DATA

FIELD OF THE INVENTION

This invention relates to petrophysical analysis, and in particular to a system and method using Monte Carlo simulations to analyze hydrocarbon zones for improved productivity.

BACKGROUND OF THE INVENTION

Large amounts of capital are spent every day drilling, evaluating, testing and completing new oil and gas wells. The elimination of unnecessary data gathering and the gathering of necessary additional information is often the subject of intense disagreements when decisions are being made throughout the drilling/exploration process. The tendency is to overpurchase new technologies with the assumption that a better answer can be reached.

The identification and evaluation of hydrocarbon productive intervals such as oil and gas reservoirs in a formation traversed by a well bore or borehole have historically been done by lowering instruments into a well and measuring petrophysical parameters such as formation resistivity and density. During the drilling, borehole samples from the formation are collected by a process called core sampling. These samples are then analyzed in laboratories and various parameters are measured to determine petrophysical properties.

The results of these measurements are then numerically processed using empirical relationships in order to calculate water saturation, porosity and permeability which describe key formation properties. These variables are key indicators of hydrocarbon volume and hydrocarbon productivity, respectively. Based on these values, petrophysicists use their experience to make a judgment and to determine the potential presence of commercial hydrocarbons.

One of the main problems with the evaluation of hydrocarbon productivity of an oil or gas well is the amount of uncertainty that exists in the measurements used to make the determination as well as the variability in the rock formations where oil and gas is found. Formation heterogeneity errors, tool measurement errors and laboratory measurement errors create uncertainties that are often difficult to determine at every depth interval of the measured values. In addition, errors in the measurements and the parameters used in the empirical relationships are carried forward and unaccounted for in the final solution. These results are then used to determine the best course of action for the well i.e. whether to test, complete or plug the well.

Accounting for these facts has been left to interpreters/petrophysicists that are seen as both scientists and artists, using empirical relationships derived from guesses and rules of thumb. The nuances in measurements are considered by the expert and a prediction based on local experience is relied upon such that these predictions have resulted in missed opportunities for every major operating company in the petrochemical field. Previous methodologies did not consider uncertainty, as all assessments were either positive or negative.

A known system, described in U.S. Pat. No. 4,338,664, was developed to forward model logging tool responses resulting in predicted logs. The differences in the predicted results were minimized through an iterative process. Ultimately the final solution to the iterative process results in a formation description that includes porosity and water saturation. The saturation is determined from a user-selected empirical-based equations using the optimized results.

Systems and methods in the prior art do not account for uncertainty in all parameters and measurements as well as the heterogeneity in hydrocarbon bearing formations.

Methods called Monte Carlo methods are known which include a class of computational algorithms for simulating the behavior of various physical and mathematical systems. Such Monte Carlo methods are distinguished from other simulation methods by being stochastic, i.e., non-deterministic in some manner, usually by using random numbers or pseudo-random numbers, as opposed to deterministic algorithms.

Monte Carlo methods are extremely important in computational physics and related applied fields, and have diverse applications. These methods have proven efficient in solving difficult problems in various fields. They are especially useful in studying systems with a large number of coupled degrees of freedom, such as liquids, disordered materials, and strongly coupled solids. Because of the repetition of algorithms and the large number of calculations involved, Monte Carlo methods are suited to calculation using a computer, utilizing many techniques of computer simulation.

It is recognized that the amount of uncertainty provides an avenue to explain an incorrect prediction. Quantification of the uncertainty boundaries by forward modeling utilizing Monte Carlo simulations overcomes these limitations.

The present invention aims to directly address the variables to enable those skilled in the art to state what is and what is not certain. The invention comprehends a system and method which employ Monte Carlo simulations to analyze hydrocarbon zones to replace the use of empirical relationships to obtain improved productivity.

BRIEF SUMMARY OF THE INVENTION

A system and method identify hydrocarbon productive zones using Monte Carlo numerical analysis to account for uncertainties in log measurements and petrophysical parameters. By incorporating random errors in logging tool responses and core measurements as well as reservoir heterogeneity in a Monte Carlo simulation, the system and method output appropriate petrophysical models to calculate statistical distributions for saturation and permeability to define productive, non-productive and undetermined zones for determining whether additional logging, core sampling or well test data are needed to reclassify the undetermined zones as either productive or non-productive. As uncertainties are quantified in the analysis, the degree of certainty in determining productive and non-productive zones is known and can be used to decide whether to test, stimulate or abandon zones.

The main improvements of the present invention are that the uncertainties in all measurements and parameters are accounted for using numerical analysis, i.e. Monte Carlo simulation. The results are used in conjunction with empirical test data to refine the areas of certainty and uncertainty. The results are then useable for clear decision-making going forward.

A forward model has been developed to quantify the errors that are inherent in two key petrophysical parameters: water saturation and permeability. Boundary conditions are determined to gain confidence in the calculations of these two parameters. The boundary conditions imposed on the water saturation will determine at every interval if the zone contains hydrocarbons, water or an indeterminate or uncertain composition. The boundary condition imposed on the permeability measurement will determine if the formation is productive, non-productive or uncertain. This quantification technique can then be used to determine the degree of certainty in productive and non-productive zones and decisions can then be made whether to test, stimulate or abandon zones. In addition, this methodology can be used to optimize the wire line log data, if more data is needed, and to suggest future core sampling, or coring, if laboratory measured data has significant variation and/or uncertainty.

This invention addresses all of the variations and an inherent uncertainty involved in this process and provides an analytical system to make the decision to move forward in a technically justifiable manner.

BRIEF DESCRIPTION OF THE DRAWINGS

Preferred embodiments of the invention are described hereinbelow with reference to the drawings wherein:

FIG. 5 illustrates a single water saturation point and the ranges of errors based on a single standard deviation;

FIG. 6 illustrates a chart that relates water saturation at different resistivity values at a single porosity of 24%;

DETAILED DESCRIPTION OF THE INVENTION

Figure 1:
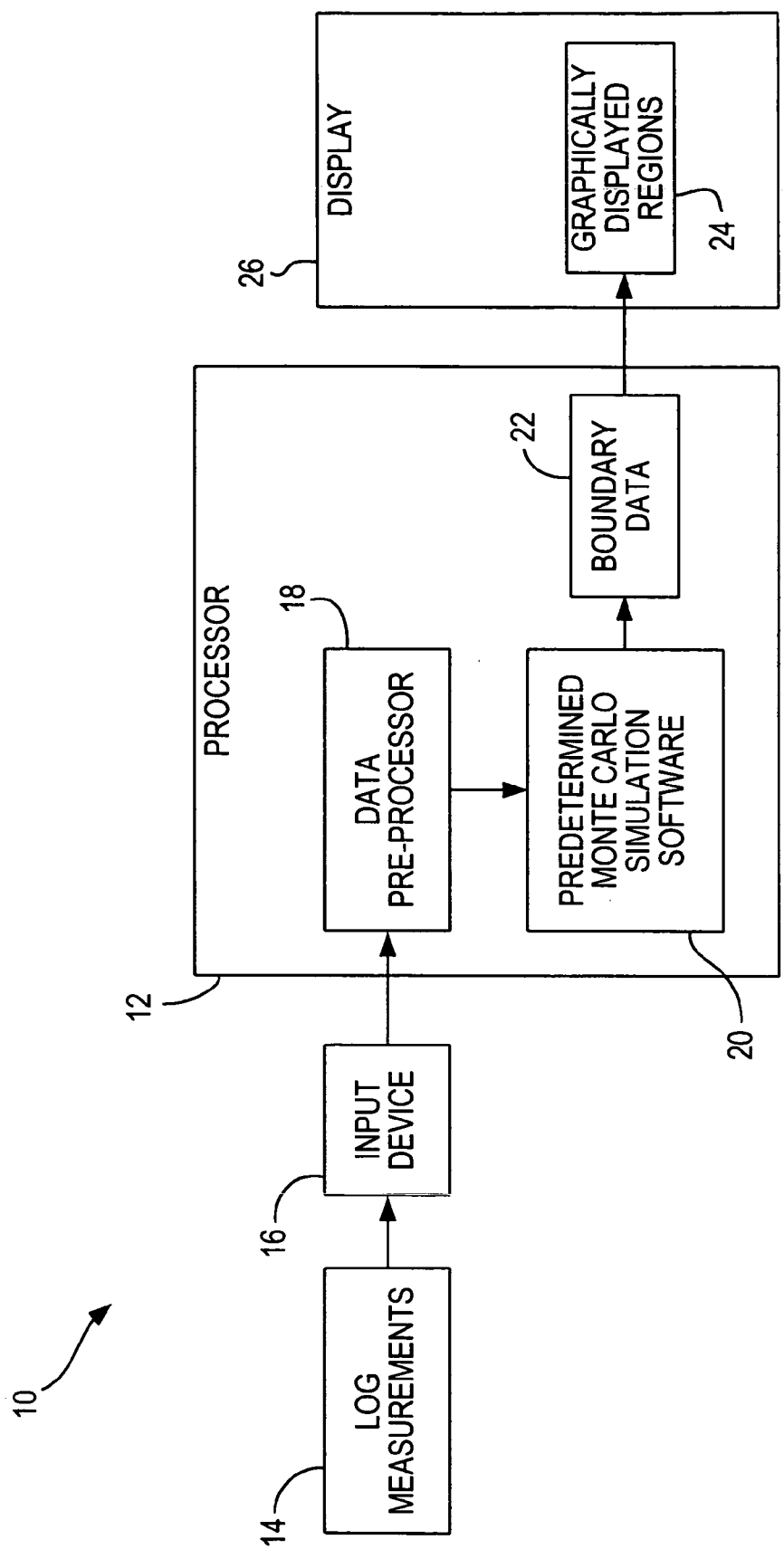
FIG. 1 illustrates a block diagram of the system in accordance with the present invention.

In the present invention, as described in conjunction with FIGS. 1-23, the system 10 and method use Monte Carlo simulations to input a range of realistic uncertainty values into every variable used in solving for water saturation Sw and Permeability (K) values. These two petrophysical parameters describe reservoir productivity by defining capacity and fluid flow capabilities, respectively. Empirical relationships used to determine these parameters utilize tool measurements and laboratory analysis. These measurements contain random and systematic errors which in combination with reservoir heterogeneity give rise to uncertainties in the final answers. A numerical simulation calculates error bars or ranges of uncertainty in Sw and K. These values are then calibrated to actual flow test results to determine a cut-off on Sw and K to identify hydrocarbon bearing and productive intervals. A prediction is then made at each data frame about what type of fluid the formation will produce and whether these fluids will flow. If the result is not certain, it is flagged to determine whether to acquire additional information, i.e. more logging data, well tests, etc.

The unique feature of this invention is that numerical analysis is used to account for all of the uncertainties that exist in the parameters and measurements used to evaluate hydrocarbon occurrence and productivity. Variations in every variable are modeled and hence the solutions have accounted for these uncertainties enabling a person skilled in the art to decide whether further information is required or a decision can be made after initial data acquisition.

The power of software and modern computers enable the present invention to account for all of the variability in petrophysical analysis. In the past, a few variables could be changed to determine the sensitivity of an answer to a particular variable, but it was not practical to address all of the uncertainty. Hence, the science of petrophysical analysis has in the prior art been seen as a form of art.

This invention is best used on a field-by-field basis. The user must examine current cutoffs being used for Sw and K before going forward. The most suitable empirical relationships for Sw and K are evaluated. Ranges of errors in each of the parameters are defined from lab analyses and from the specifications provided by the logging vendor for the logging equipment used. If well testing has been done, the results can be used to further enhance the invention's ability to predict new well performance.

Reliable economic evaluation of a reservoir requires reasonable knowledge of fundamental reservoir properties. Although rocks recovered by core sampling methods are the cornerstone to formation evaluation, well log data are more universally used for determining fundamental reservoir properties. Well log data are the result of the measurements of the physical properties of rock matrix material and the fluids that occupy the pores. Quite naturally, well log and core data are often compared and used in conjunction in empirical relationships to define reservoir properties, namely porosity, hydrocarbon saturation and permeability. These parameters define capacity and flow capabilities of fluids.

As illustrated in FIG. 1, the system 10 of the present invention includes a processor 12, such as a computer, which receives well log measurements 14 of a reservoir under test via an input device 16, which can including a keyboard for data entry. Such well log measurements are processed by the processor 12 using a data pre-processor 18 employing, for example, a microprocessor for calculating porosity values, water saturation values, and permeability values of the reservoir. A predetermined Monte Carlo simulation software program 20 is executed by the processor 12 to generate boundary data 22 from the calculated porosity values, water saturation values, and permeability values of the reservoir, with the boundary data 22 corresponding to productive, non-productive and undetermined productive zones for hydrocarbon drilling associated with the reservoir corresponding to the well log measurements 14.

Such productive, non-productive and undetermined productive zones are displayed graphically as regions 24 on a display 26, which can be a color display with such regions 24 being distinctively indicated by color coding for each type of zone.

Figure 2:
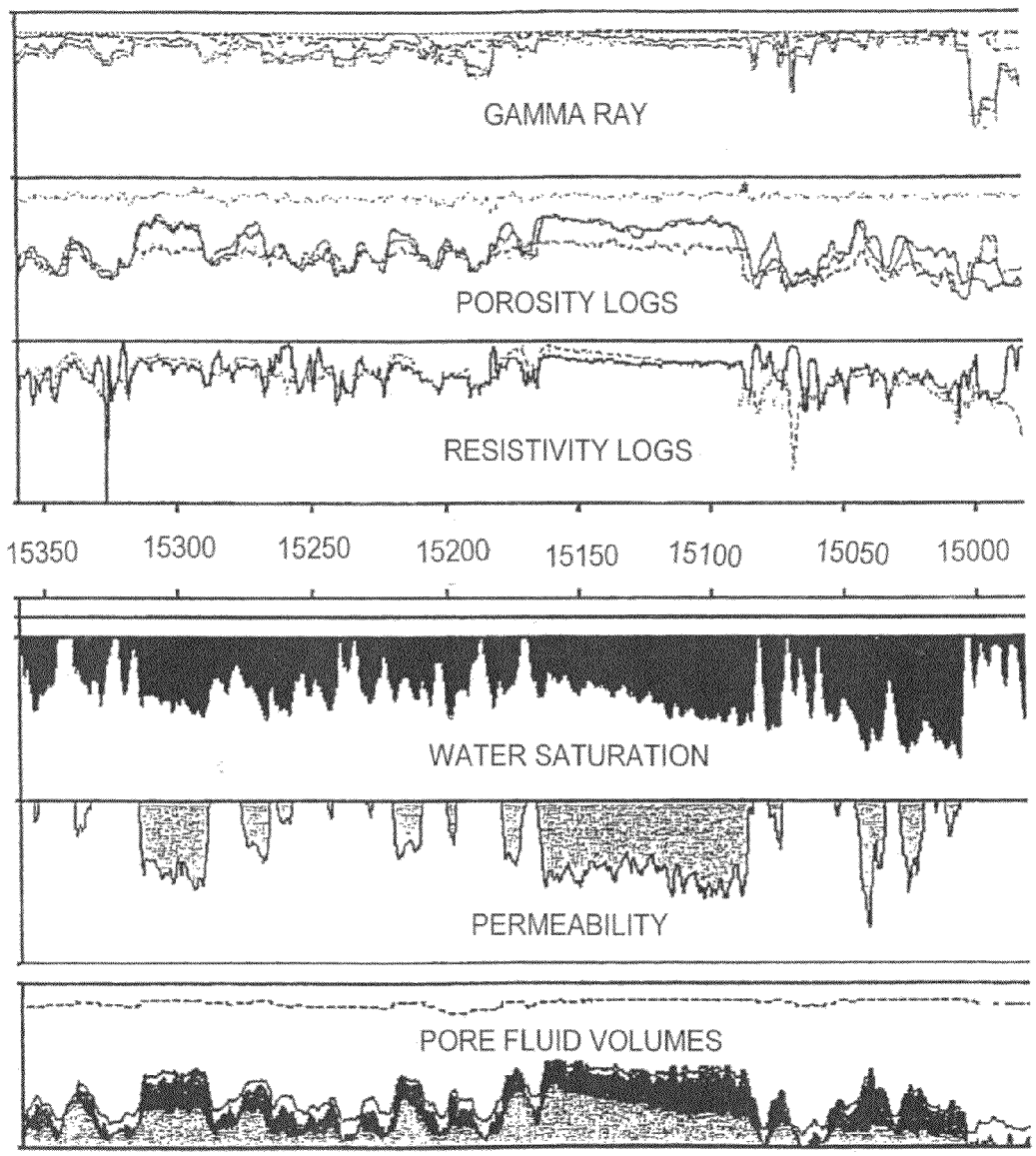
FIG. 2 illustrates a petrophysical analysis that utilizes several different types of well log data in the prior art to compute these various parameters.

FIG. 2 illustrates a petrophysical analysis that utilizes several different types of well log data to compute the hydrocarbon saturation and permeability parameters. These values are then used to determine the economic value of the reservoir by an imposition of cut. As shown in FIG. 2, natural gamma ray data, porosity data from a formation density measurement tool, a neutron porosity tool and/or a sonic tool and resistivity data are used to calculate hydrocarbon and/or water saturation and permeability. Limits imposed on porosity, permeability and hydrocarbon and/or water saturation are then used to determine the disposition of the well, i.e. to test, stimulate, or acquire additional data. The limits are determined by local knowledge, prior test results and laboratory analysis.

A fundamental problem with the described methodology is the deterministic approach of the computed results. The sensitivity of the errors that are associated with the well log data and parameters that are used in the empirical equations (laboratory data) are not included in the final analysis. These errors are dependent on several parameters and thus their relative effects have not been fully utilized in the prior art. In addition, reservoirs with heterogeneous rock types further complicate the analysis, where one can not account for the changes in the rock types.

The system and method of the present invention has been developed where numerical analyses used in Monte Carlo simulations have been used to determine the effect of these errors and the associated uncertainties on the final computations.

The following are the steps that are taken to quantify uncertainty in the three listed reservoir rock parameters: porosity, water saturation and permeability.

Porosity Uncertainty Determination

The ratio of a volume of void spaces within a rock to the bulk volume of that rock is commonly expressed as porosity. This value is calculated by a single measurement tool or a combination of wireline logging tools that are sensitive to this parameter. The following is a list of wireline logging tools that make this measurement.
 a. formation density:
 b. neutron sonic;
 c. sonic/neutron;
 d. density/neutron; and
 e. nuclear magnetic resonance.

Even though all of these measurements have their uses, the density measurement will be illustrated here as an example to quantify errors in the porosity measurement. The density tool measures the bulk density of the formation. The following relationship is used to calculate porosity from density measurements:

$$\Phi = \frac{\rho_{ma} - \rho_b}{\rho_{ma} - \rho_{fluid}}, \qquad (1)$$

where $\Phi$ is the formation porosity, $\rho_{ma}$ is the bulk matrix density of the rock, $\rho_b$ the bulk density measured by the density tool, and $\rho_{fluid}$ is the fluid density within the pore space. There are errors that are associated with each of these variables. In order to determine the errors in the calculated porosity, a Monte Carlo simulator utilizes the associated errors with each of these variables to predict the errors in the final answer. A key component in the numerical analysis is the amount and the distribution of the errors that are associated with each of the inputs. These values are determined during the development phase of the logging instruments and thus published by the service vendors. In this example, the errors associated with these measurements are normally distributed and is a function of the formation bulk density.

Figure 3:
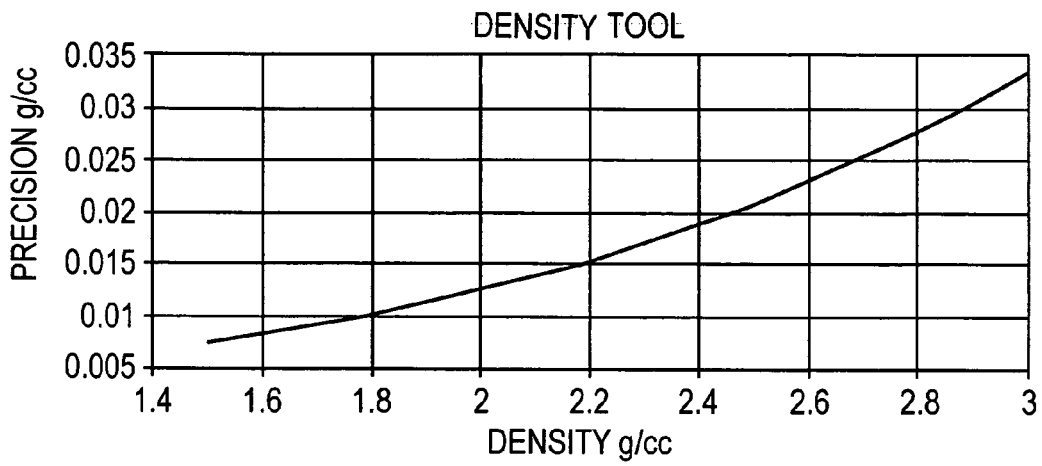
FIG. 3 illustrates the distribution of errors that is associated with well log measurements as a function of formation bulk density.

FIG. 3 illustrates the distribution of errors that is associated with these measurements as a function of formation bulk density. The precision of these measurements is a function of the formation bulk density. There is an inverse relationship between the precision and the bulk density.

Figure 4:
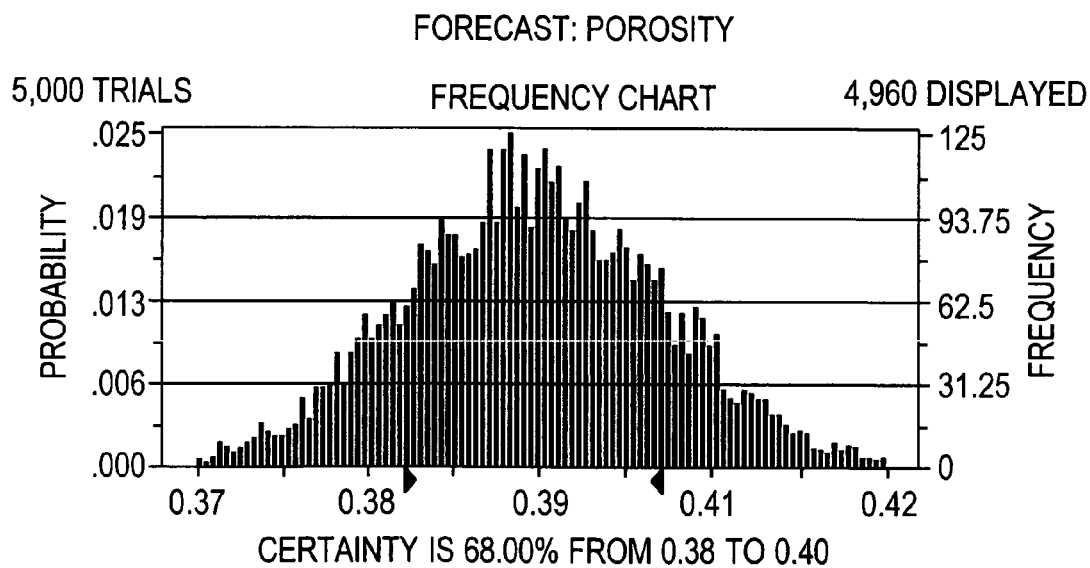
FIG. 4 illustrates an example of a forecast of errors in porosity rock based on one standard deviation.

Equation 1 is used in a numerical analysis to forecast the errors in porosity. FIG. 4 illustrates an example of a forecast of errors in a 39% porosity rock based on one standard deviation, i.e. 68%. In this example the error associated in this example are ±1 times a porosity unit (pu). Errors associated with density porosity measurements, based on density porosity values and based on one standard deviation the error in the answer can be ±1 pu.

Since this example illustrates a single porosity point, several simulations should be performed to determined errors in a porosity range. These porosity values and their related uncertainties are then used in numerical analysis of water saturation and permeability.

Water Saturation Uncertainty Determination

One of the most important parameters in a petrophysical evaluation is water saturation, Sw. This parameter determines the percentage of water in a reservoir and conversely the volume of hydrocarbons. During the past 60 years many different types of equations have been developed that relate wireline measurements to water saturation. One of the most notable relationships is the Archie's formula:

$$Sw = \left[\frac{R_w}{\Phi^m R_t}\right]^{1/n}, \qquad (2)$$

where Sw is the water saturation, $R_w$ is the resistivity of the connate formation water which is the water trapped in pores of the reservoir rock during formation of the rock, $\Phi$ is the computed porosity from the well log data, $R_t$ is the measured formation resistivity from well log data, n is the saturation exponent, and m is referred to as the cementation exponent. All of these variables have different associated uncertainties that are based on the physics of the measurements. Uncertainties in measurements have normal distributions that can be calculated as shown in the previous section. $R_t$ measurements are provided by different types of resistivity devices and uncertainties in these measurements are provided by the service providers, i.e. measurement tool vendors. Saturation and cementation exponents are measured on rock samples that are collected during the core sampling stage of drilling. The uncertainties in these values arise from the statistical errors associated with laboratory analysis and sampling techniques. In heterogeneous reservoirs, rock sampling can introduce large errors in determination of these parameters. In addition, integrating these parameters to tool responses in Equation 2 can become cumbersome, since tool responses can be different. $R_w$, the formation water resistivity, is a measurement that is performed on water samples. The error associated with this variable is based on laboratory analysis.

As an example, the following uncertainties were used in a Monte Carlo simulation to quantify the uncertainty at a single point. These numbers are typical values used in Middle East reservoirs:

Φ=0.25-uncertainty (±1 pu), determined as shown in previous section (Normal distribution);

$R_w$=0.012 ohm-meter (no statistical distribution);

$R_t$=2 ohm-meter, with an uncertainty of ±7%, based on published values (Log-Normal Distribution);

m=2 (between 1.7-2.17) (Box distribution based on the range of the laboratory studies); and n=1.6 (between 1.4-1.89) (Box distribution based on the range of the laboratory studies.

FIG. 5 illustrates a single water saturation point and the ranges of errors based on a single standard deviation. In this example, the water saturation could range between 27% to 35%. As this example only represents a single point, several thousand numerical simulations were performed to determine water saturation uncertainties with a range of input and parameter values. FIG. 6 illustrates a chart that relates water saturation at different resistivity values at a single porosity of 24%. As shown in FIG. 6, the top and bottom lines show a one standard deviation error in saturation as a function of resistivity based on a single value of formation connate water resistivity as a function of formation resistivity measured values, with the indicated predicted line being the best predicted measurement of water saturation.

Figure 7:
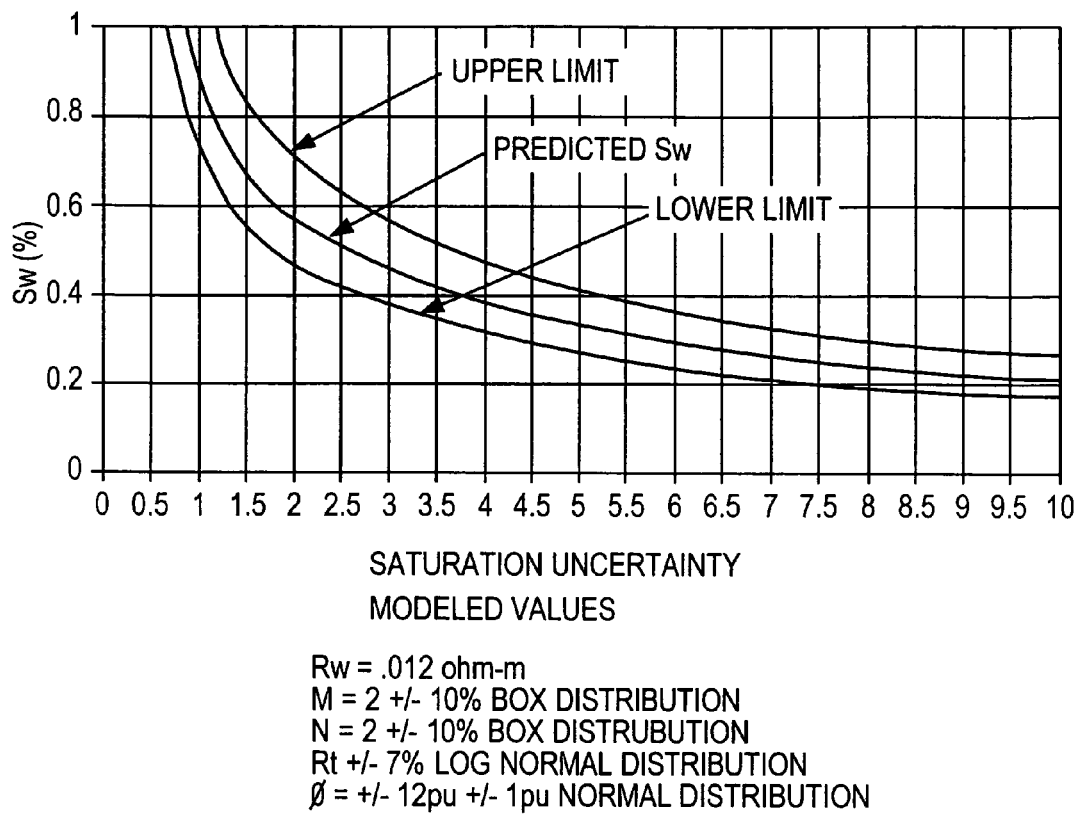
FIG. 7 illustrates a chart for a 12% porosity formation.

FIG. 7 illustrates this example in a 12% porosity formation. Note the increase in the water saturation error in this lower porosity formation with respect to the previous higher porosity example. The lines in FIG. 7 represent the errors in water saturation errors based on a single porosity as a function of formation resistivity measured values. The indicated predicted line is the best predicted measurement of water saturation. Note the increase in the errors with respect to the graph of FIG. 6.

Permeability Uncertainty Determination

Permeability defines the ability of fluid to flow within a reservoir. This important parameter, in addition to water saturation, is used to determine the productivity of a reservoir. In order to determine the amount of uncertainty in permeability, the same procedures were carried out as shown in the previous section.

Permeability equations are locally developed by relationships to porosity and water saturation. As an example, the following equation is a relationship that was developed for the Devonian sandstones in the Middle East:

$$K = \left[\frac{200(\Phi^{4.5})}{Sw^2}\right], \quad (3)$$

where K is the permeability in milliDarcies (md), Φ is the calculated porosity from well log data and Sw is the water saturation.

Figure 8:
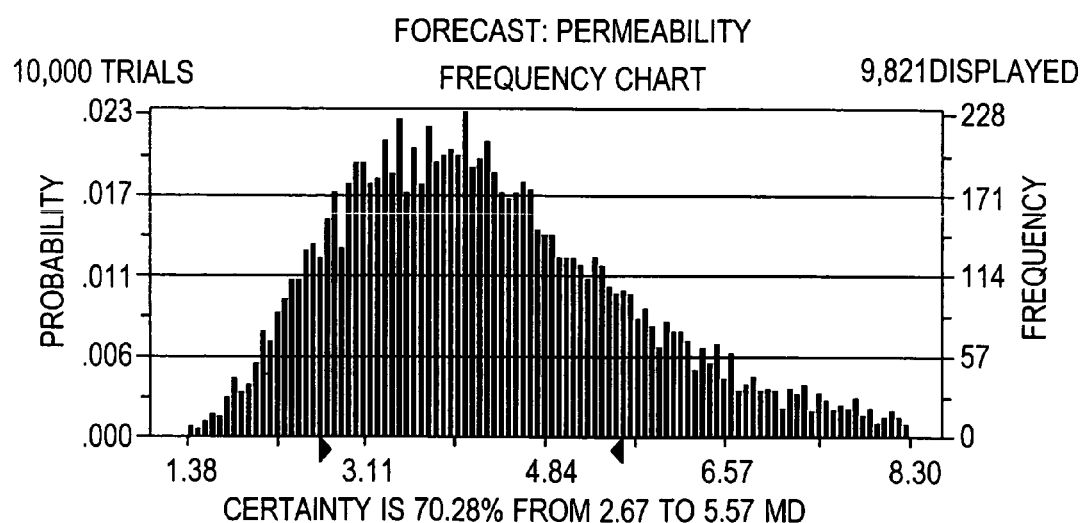
FIG. 8 illustrates a chart with errors associated with calculated permeability.

Results from error analysis from porosity and water saturation are carried out to define the error in the permeability. FIG. 8 is an illustration of the log-normal distribution of the calculated permeability and the associated errors. Based on the skewness, a 70.28% standard deviation represents one standard deviation. In this example, based on a formation resistivity of 2 ohm-meter (±7%, published), porosity (0.25±1 pu), constant connate water resistivity, cementation exponent of 2 (10%) and saturation exponent of 2 (±10%), a permeability range of 2.67-5.57 md is observed. A multitude of numerical analyses were then be use to represent a range of parameters.

Figure 9:
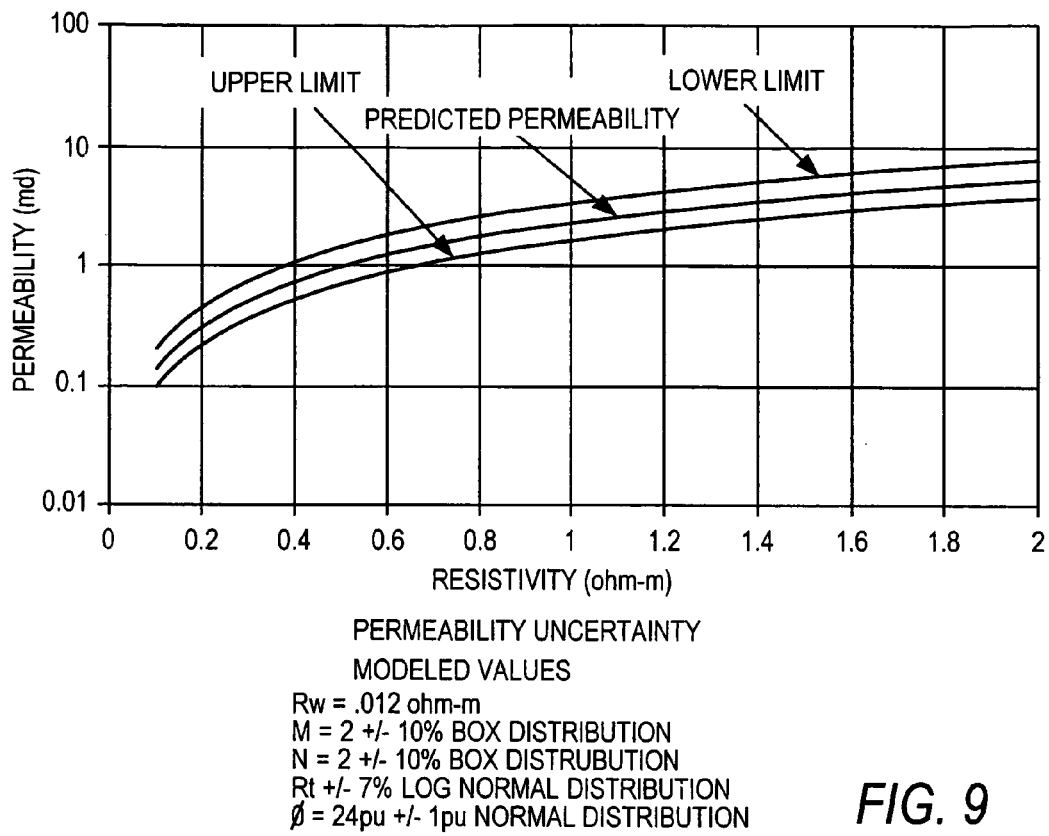
FIG. 9 illustrates a graph of simulation runs of permeability as a function of resistivity at a porosity value of 24%.
Figure 10:
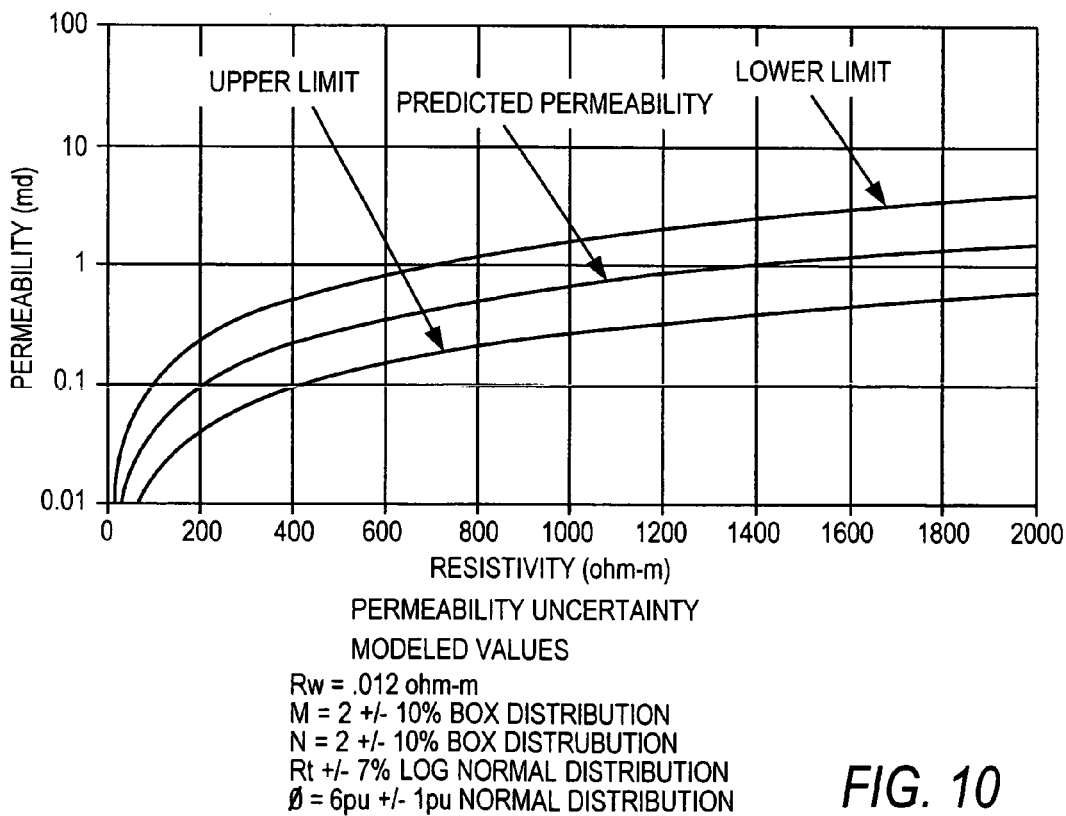
FIG. 10 illustrates a graph of simulation runs of permeability as a function of resistivity at a porosity value of 6%.

FIGS. 9-10 are graphs illustrating simulation runs of permeability as a function of resistivity at two different porosity values, 24% and 6%, respectively. The lines represent the error bars associated with permeability. Note the increase in the errors in the lower porosity formations.

Model Calibration

Figure 11:
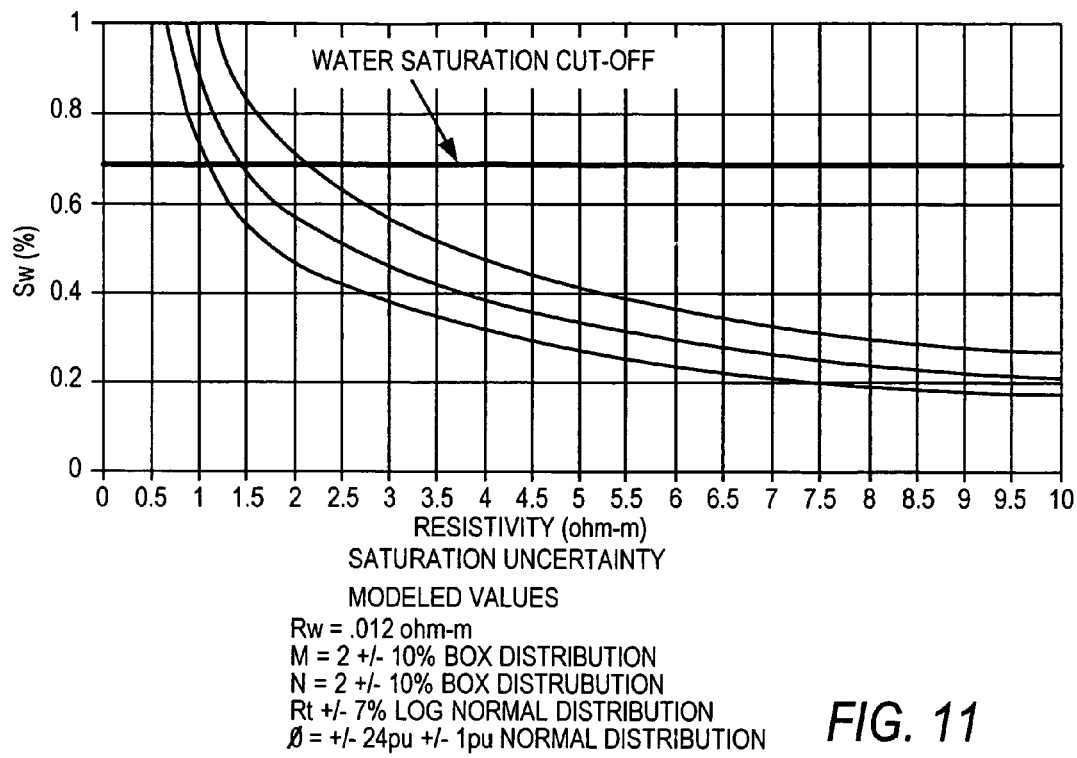
FIG. 11 illustrates a water saturation cut-off line imposed on a water saturation chart.
Figure 12:
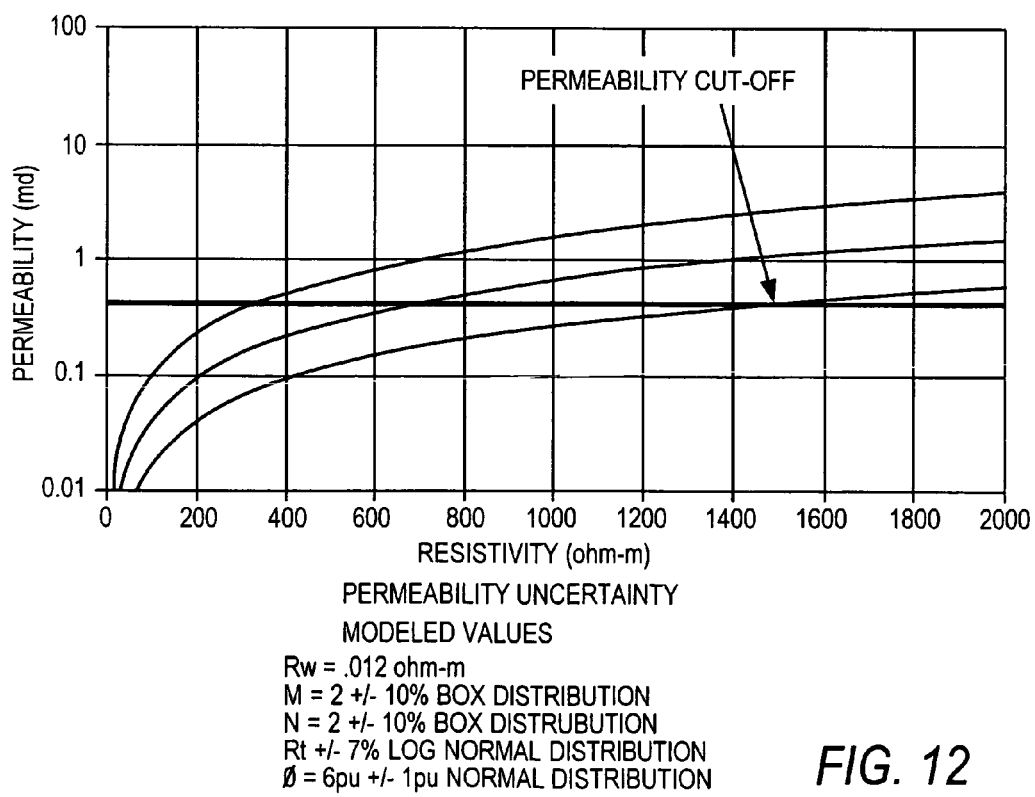
FIG. 12 illustrates a permeability cut-off line imposed on a permeability chart.

Model calibration is a procedure that compares the calculated data to actual flow analysis. Results from flow tests are used to determine a "cut-off that describes a formation as being productive or non-productive. These limitations are imposed on the two calculated parameters, water saturation and permeability. FIGS. 11 and 12 illustrate this issue by placing a cut-off line, such as a horizontal black line, to determine whether the regions are productive or non-productive based on the flow test results, with the water saturation cut-off line imposed on the water saturation chart in FIG. 11, and the permeability cut-off line imposed on the permeability chart in FIG. 12. In these examples, 65% and 0.4 md were used for the water saturation and permeability, respectively.

Figure 13:
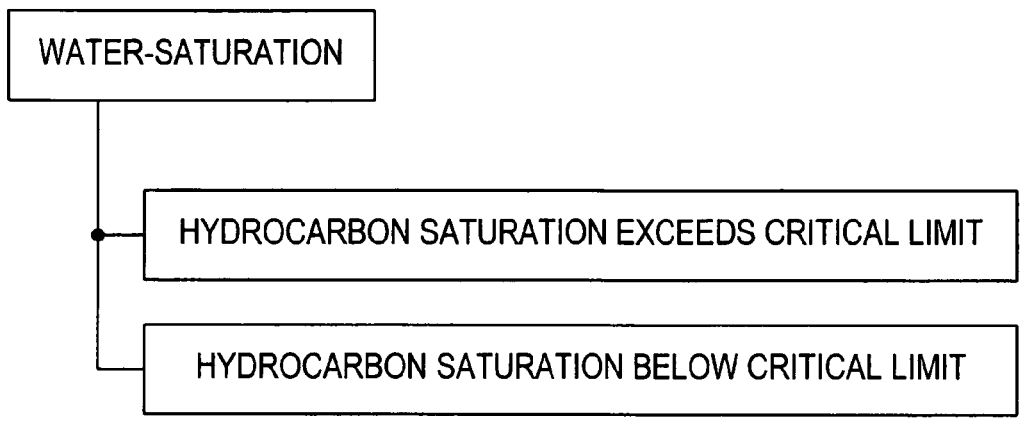
FIG. 13 is a schematic illustration of the classifications of productive zones for water saturation in the prior art.
Figure 14:
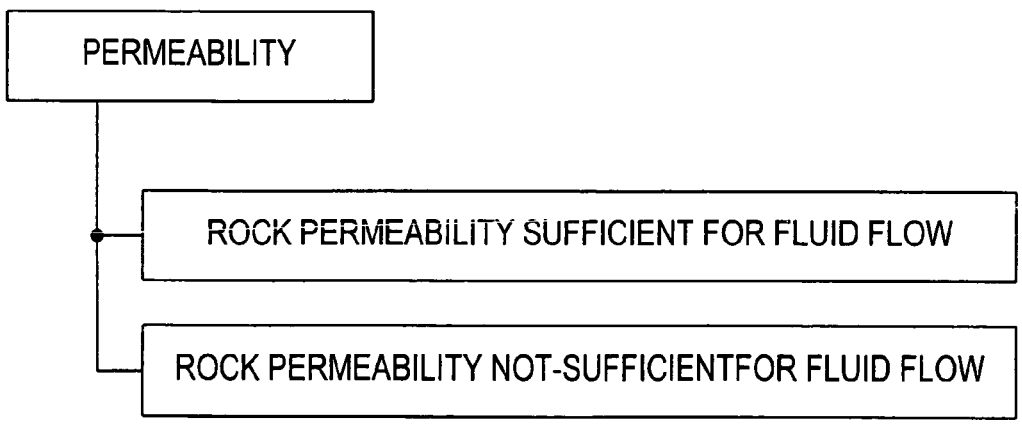
FIG. 14 is a schematic illustration of the classifications of productive zones for permeability in the prior art.

FIGS. 13 and 14 illustrate the classifications of productive zones using the analysis for water saturation and permeability, respectively, in the prior art, which are either positive or negative and therefore lack any determination of uncertainty meriting additional testing or data acquisition for the subject reservoir under test.

Referring to FIGS. 11 and 12, the intersection of the cut-off line with the upper, predicted and lower values classifies three regions of the reservoir under test, as used in the present invention:

1. for water saturation;
   a. above upper limit certain hydrocarbon capacity;
   b. below lower limit certain no-hydrocarbon capacity; and
   c. between the upper and lower uncertain hydrocarbon capacity.
2. for permeability
   a. above upper limit certain flow;
   b. below lower limit certain non-flow; and
   c. between upper and lower limit uncertain flow.

Figure 15:
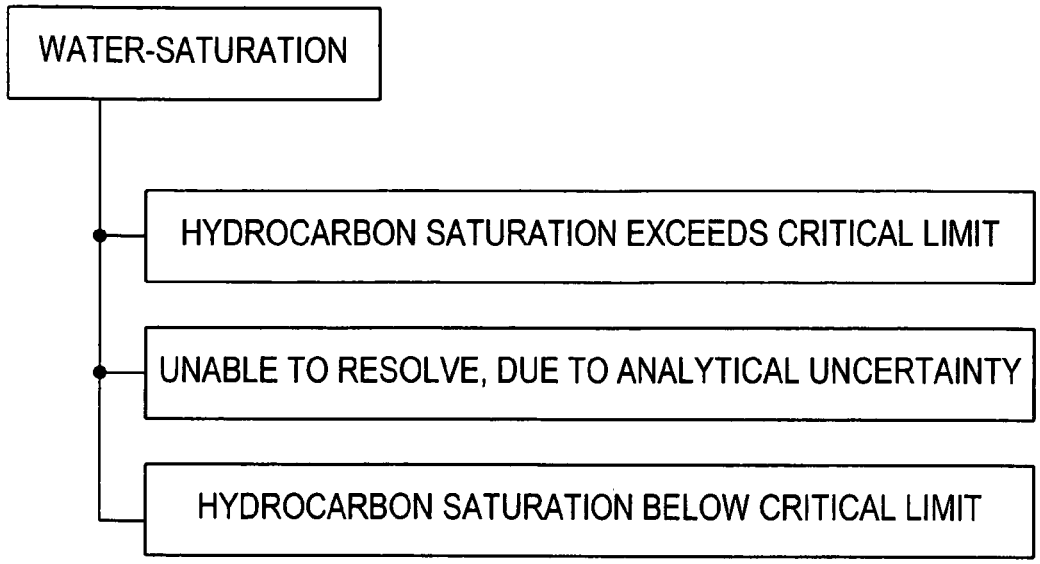
FIG. 15 is a schematic illustration of the classifications of productive zones for water saturation used in the present invention.
Figure 16:
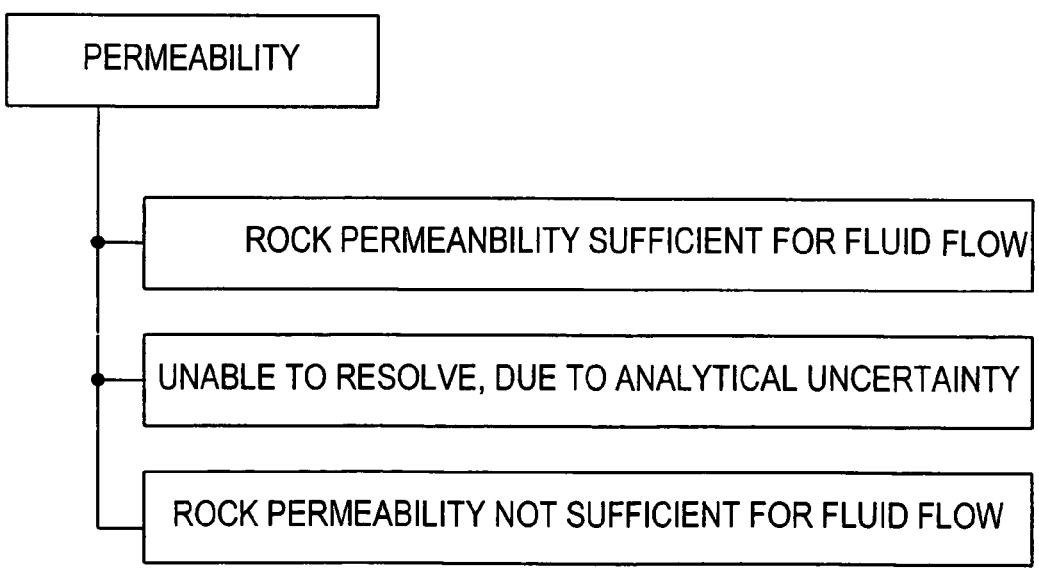
FIG. 16 is a schematic illustration of the classifications of productive zones for permeability used in the present invention.
Figure 17:
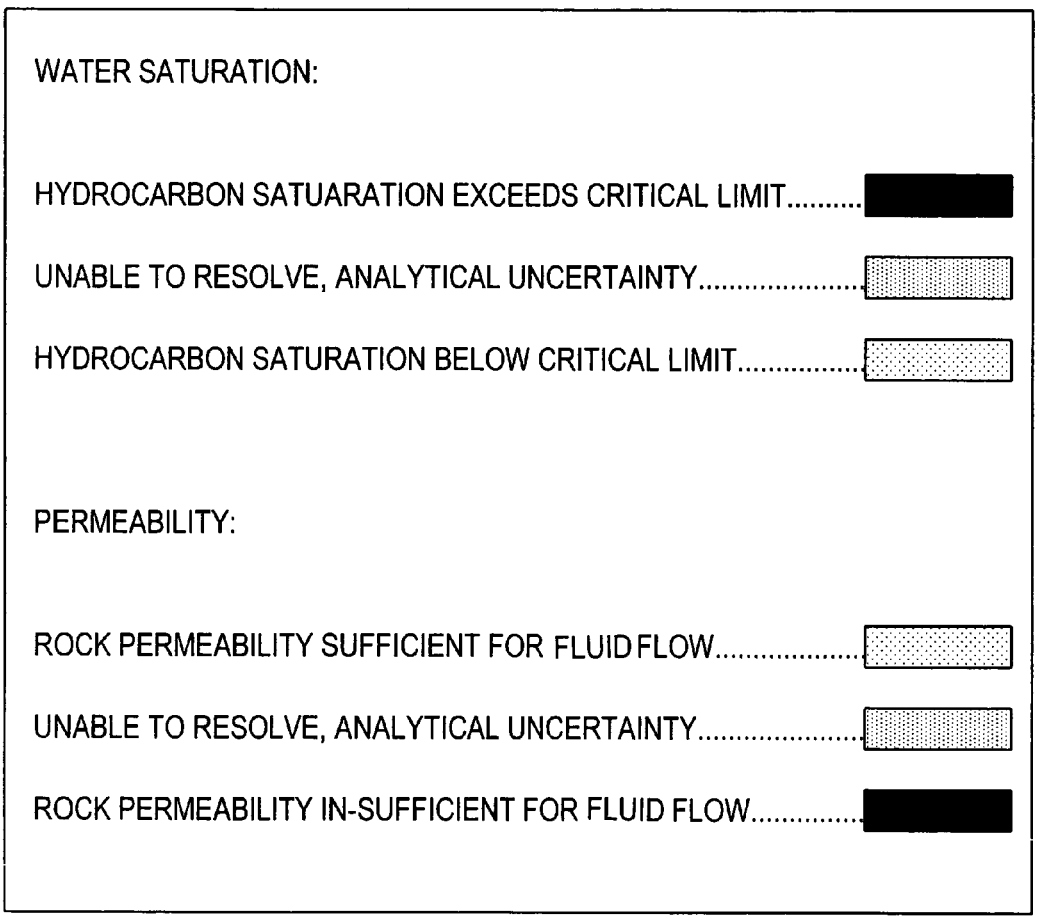
FIG. 17 illustrates an example of shaded productive zones.

FIGS. 15 and 16 illustrate these newly defined classifications of productive zones of the reservoir under test as used in the present invention in the analysis and determination of cut-off lines for water saturation and permeability, respectively.

Software Design

In a typical reservoir, rock properties change at every depth interval, thus a single point cannot address uncertainty quantification problems across the entire interval. In order to address this issue, several Monte Carlo analyses are performed using the system 10 in FIG. 1 at different porosity values using the predetermined Monte Carlo software program 20 implementing known Monte Carlo techniques, for example, as described in U.S. Pat. Nos. 4,926,394 and 5,586,082, each disclosure of which is incorporated herein by reference in its entirety.

Based on a typical formation, porosities are chosen to have values between 0% to 30%. The cut-off line is then used to determine the upper and lower boundary points at every porosity point. The predetermined software program 20 is used to identify the zones above the upper boundary, below the lower boundary and between boundaries. This analysis is performed on both water saturation and permeability K. A color coding scheme can be used to identify each of the graphically displayed regions 24 on the display 26, for example, as shown in FIGS. 17-23.

For water saturation, the regions can be indicated by hydrocarbon saturation either exceeding or being below a critical limit, or a region unable to be resolved and having analytical uncertainty. For permeability, regions can be identified as having a rock permeability either sufficient or insufficient for fluid flow, or a region unable to be resolved and having analytical uncertainty.

Figure 18:
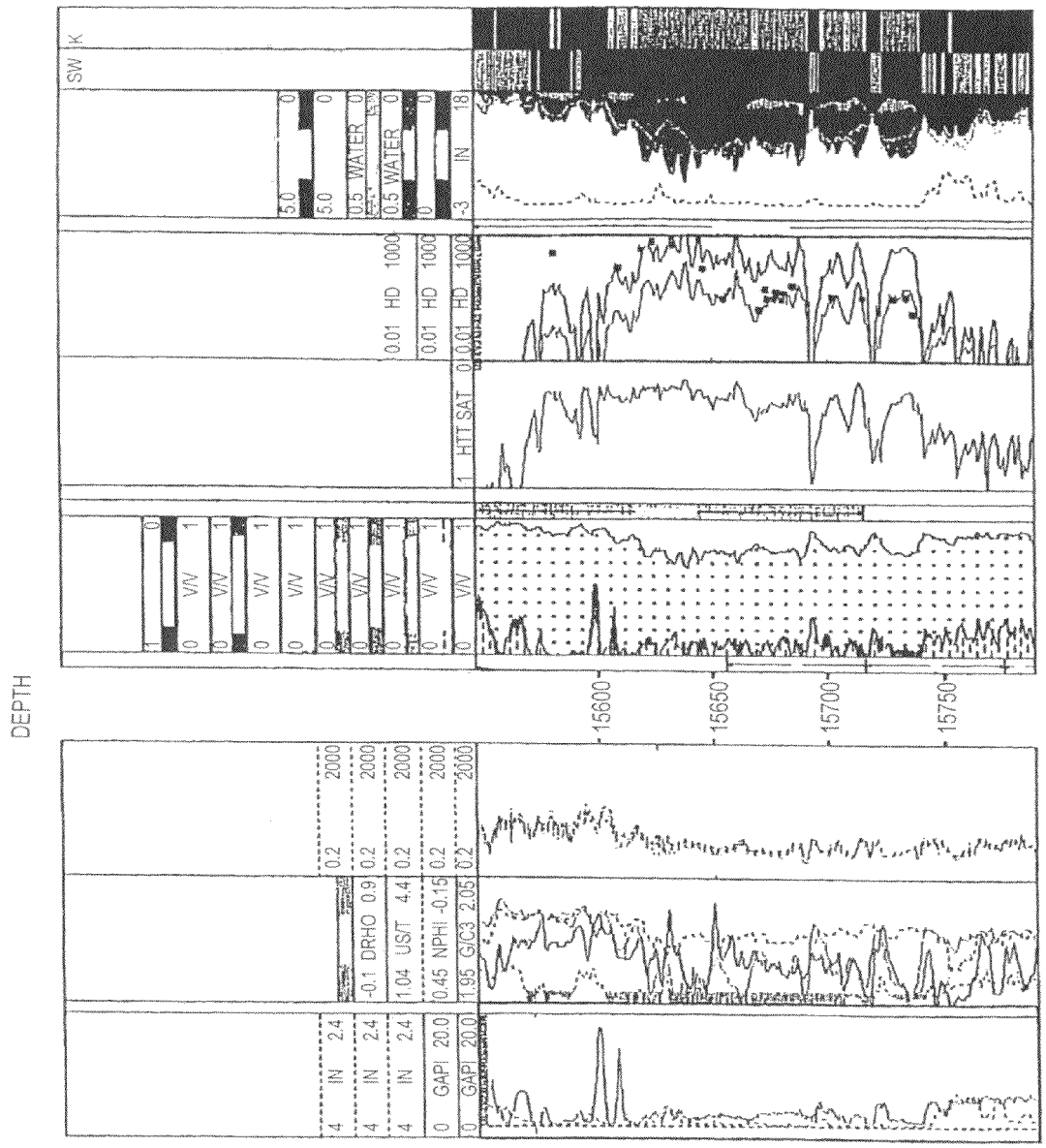
FIG. 18 illustrates the analysis of water saturation and permeability of a first well.

FIG. 18 illustrates the analysis in water saturation and permeability, respectively, in the last columns of the display in an example for a first test well. As shown in the second column from the right in FIG. 18, for the water saturation (the Sw column), the various shades of colors can represent different materials and characteristics. For example, red color can represent the hydrocarbon, orange can represent an uncertain region and cyan can represent water. In the last track on the right in FIG. 18, for the permeability (K) column, green can represent a definite flow, orange can represent the uncertain flow region and brown can represent the no-flow region.

Field-Test Results

This analysis has been tested in a number of wells in different fields. All of the analyses in the wells were compared to actual flow test results. In all of the cases, the analyses predicted the actual test results and proved extremely powerful in optimizing logging and testing operations. The following are six examples that have been shown in these different fields, in which FIGS. 18-23 illustrate the analysis of water saturation and permeability of the six wells, respectively.

Well 1 was drilled to 15,715 feet, logged, tested and then drilling continued to deeper targets and logged again. The Sw and K Decision Logs shown in FIG. 18 indicate a prolific hydrocarbon productive interval from 15,618 to 15,740 feet. As shown in FIG. 18, the well test results, the NMR tool and the wireline formation test tool all confirm what the Decision Log outputs indicate: a productive interval and no gas-water contact.

Figure 19:
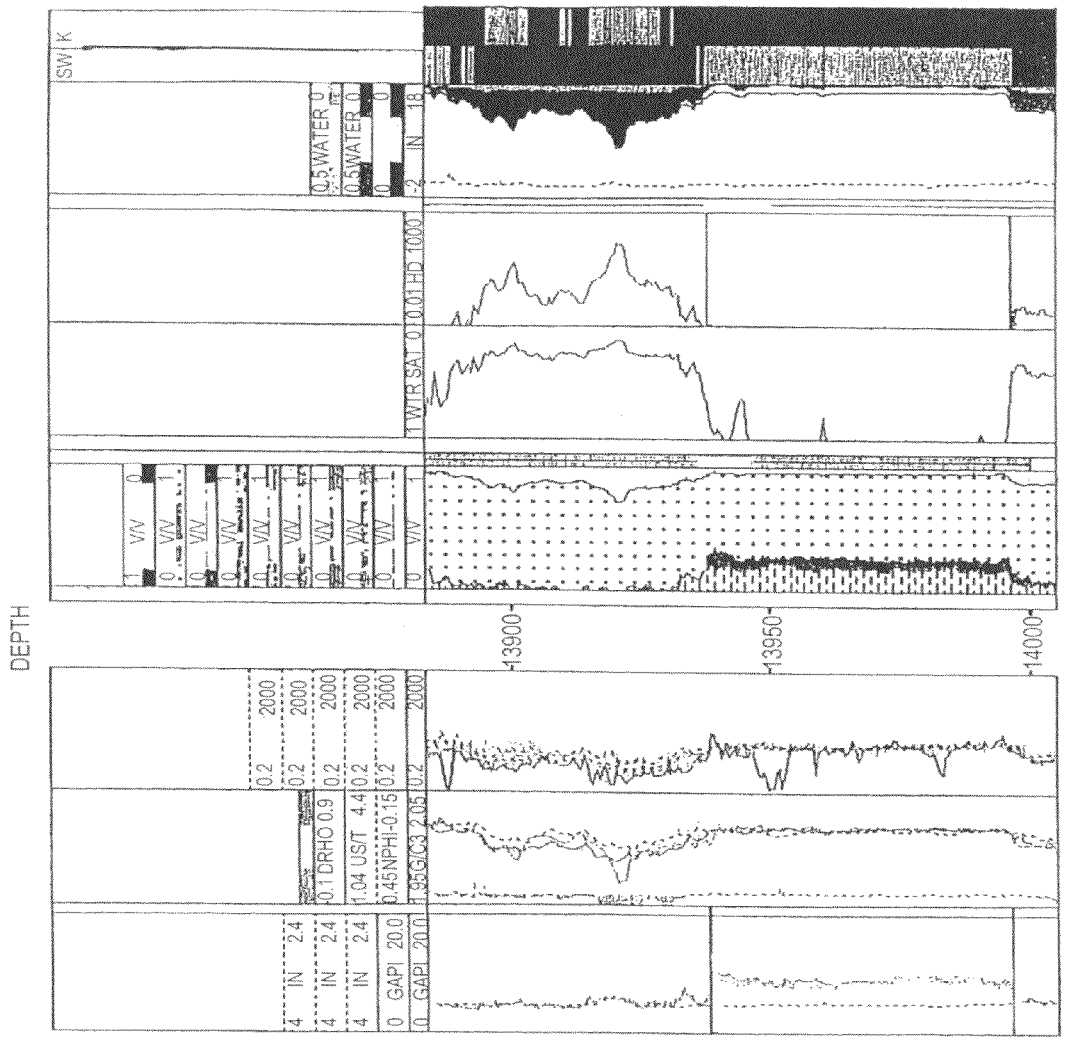
FIG. 19 illustrates the analysis of water saturation and permeability of a second well.

Well 2 was drilled to 14,000 feet and an open-hole well test was performed. No logs were run prior to the test and logging that was completed after drilling the well to total depth (TD) show that the test actually commingled five feet of the lower reservoir with the upper reservoir. As shown in FIG. 19, the Sw Decision Log identifies both reservoirs as hydrocarbon bearing. However, the K Decision Log in the lower reservoir indicates an uncertain result with respect to flow capacity. Only the upper reservoir has certain flow capacity. Although the well produced 41 million standard cubic feet (mmscf/d) of hydrocarbons, the test did not resolve the uncertainty in the lower reservoir.

Figure 20:
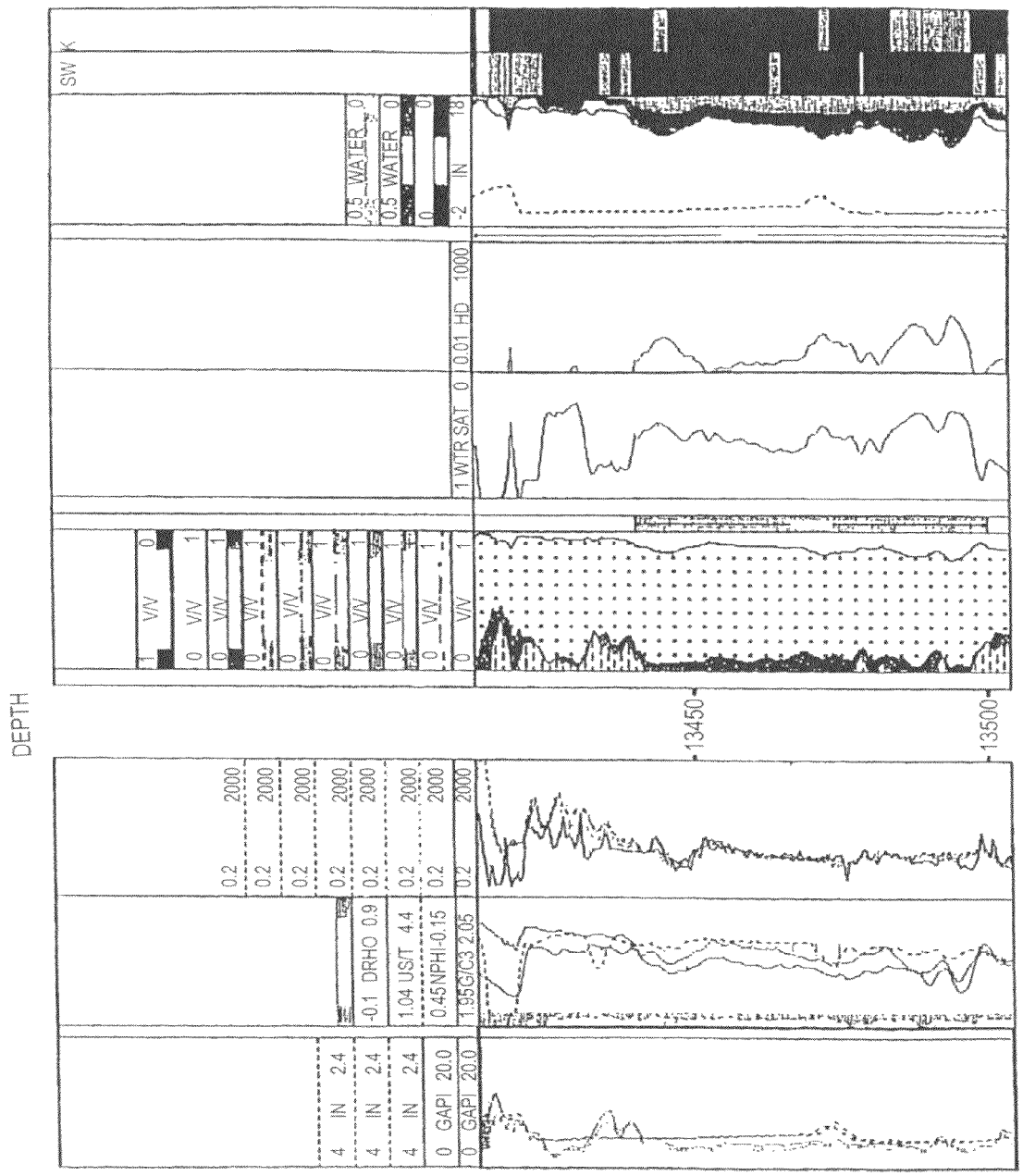
FIG. 20 illustrates the analysis of water saturation and permeability of a third well.

Well 3 was drilled, logged and completed for cased hole testing. As shown in FIG. 20, over much of the test interval the K Decision Log is brown indicating a tight reservoir, and it does show approximately four feet of the zone with flow capacity. Almost the entire Sw Decision Log confirms this to be a hydrocarbon bearing interval. The low rate from the cased hole test confirms both the small productive zone as well as the tight reservoir response seen on the K Decision Log over much of the perforated interval.

Figure 21:
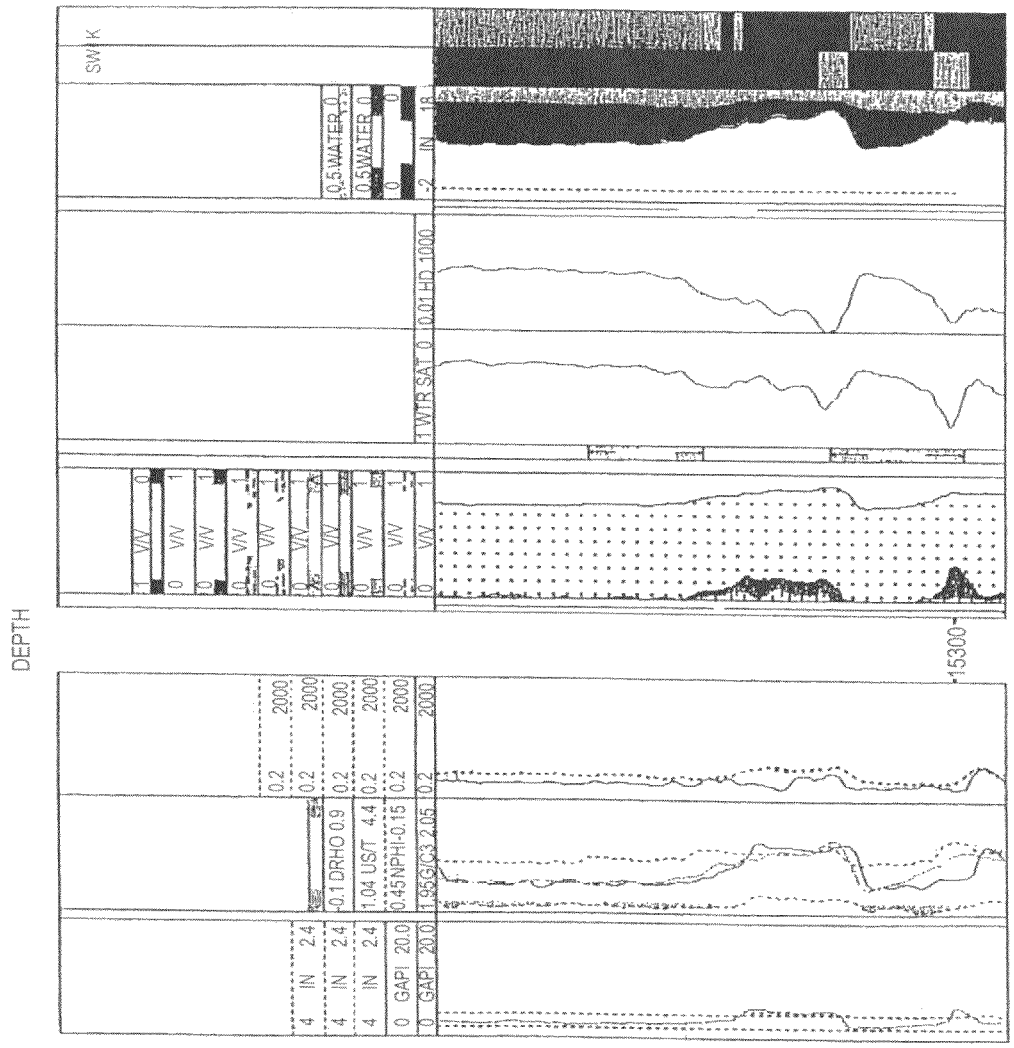
FIG. 21 illustrates the analysis of water saturation and permeability of a fourth well.

In the fourth well illustrated in FIG. 21, the increasing water saturation with depth prompted a cased hole test program that would enable the location of free water. The upper test flowed gas and condensate and no water as expected from Sw and K Decision Logs. The lower zone was added and the zones were commingled. In this test interval the Sw Decision Log identifies water at 15,900 ft. The test result from the commingled test included 33 barrels per day (bbl/d) of formation water.

Figure 22:
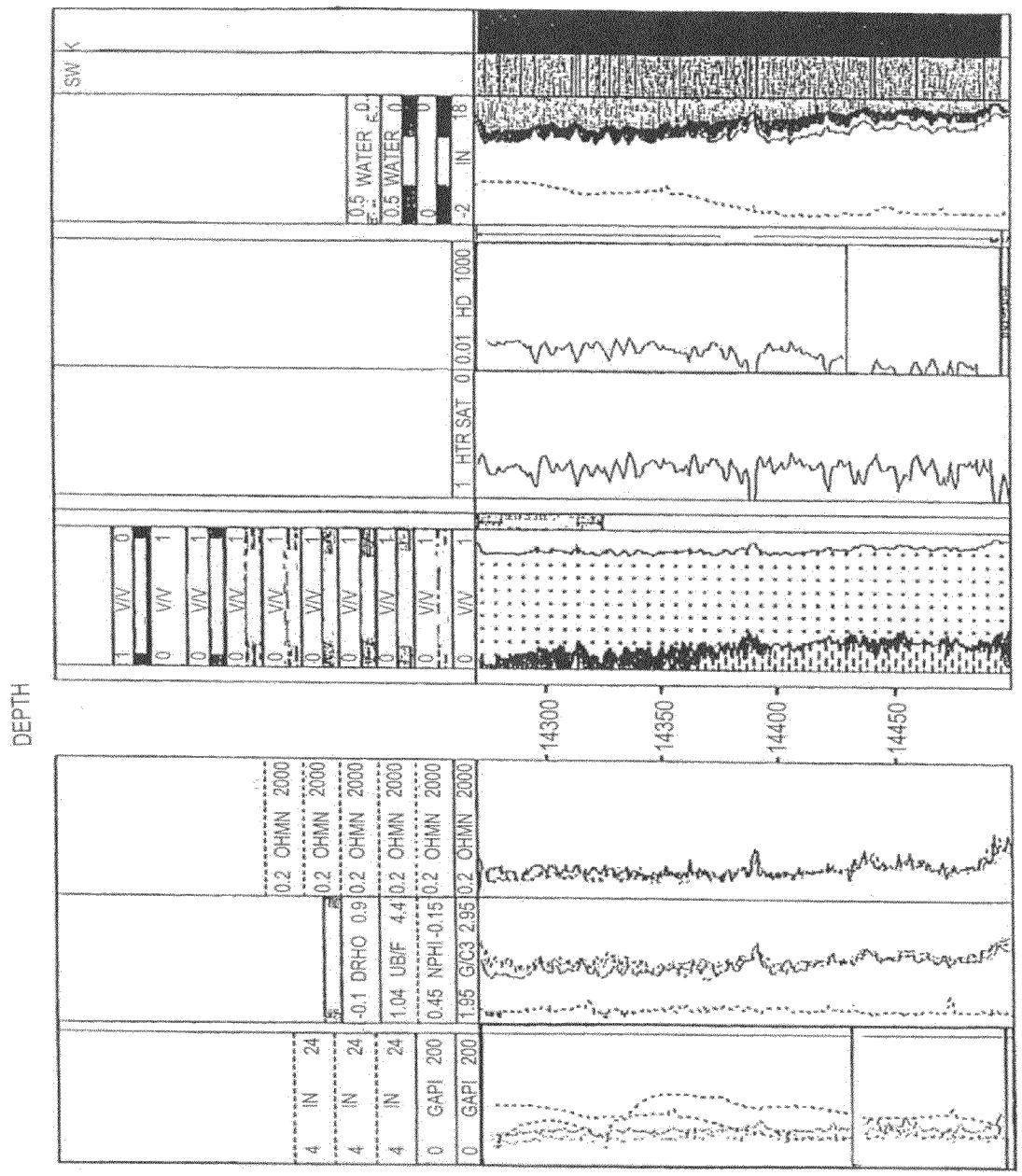
FIG. 22 illustrates the analysis of water saturation and permeability of a fifth well.

Well 5 was a development well. The well was logged with a basic suite of log measurements, and a liner was run to TD. As shown in FIG. 22, the Sw Decision Log identifies the target sand as tight over the entire reservoir. The Sw Decision Log shows the zone as water bearing near the top and uncertain over much of the interval. The well was tested and confirmed to be a tight water bearing sand. The well would not produce to surface and 92 bbls of formation water were recovered through nitrogen lifting.

Figure 23:
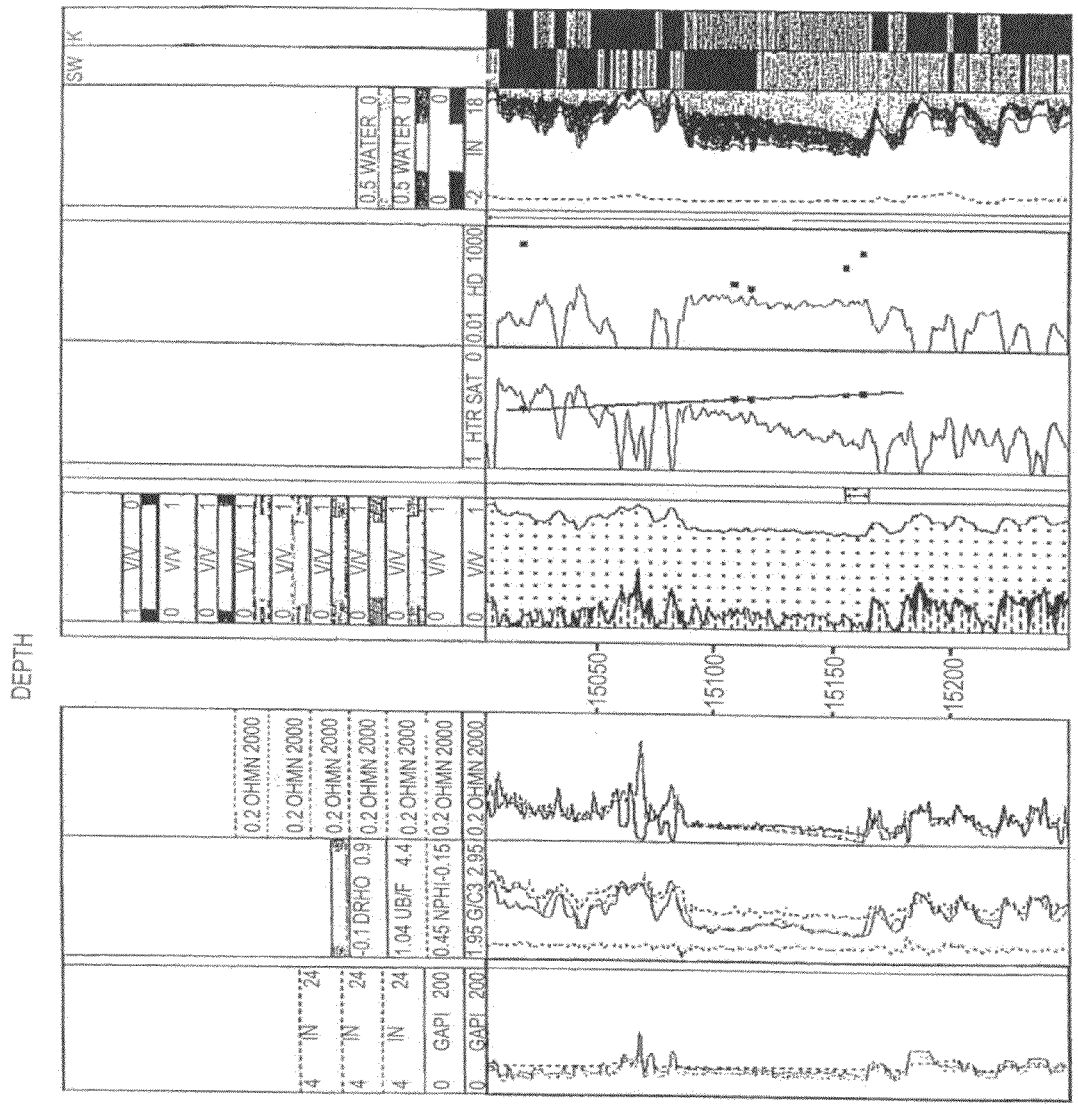
FIG. 23 illustrates the analysis of water saturation and permeability of a sixth well.

Well 6 was drilled as a development well. As shown in FIG. 23, the resistivity log showed an unusual drop in the main reservoir package. Many theories about what was causing the drop in resistivity from 15,115 feet to 15,160 feet were developed. It appeared to be a long transition zone and the bottom ten feet of this zone was tested during the completion phase of the well. The Sw and K Decision Logs indicated that water would be produced. The 230 bbl/d water rate was steady.

Geochemical analysis of the water confirmed that it was formation water. As shown in FIG. 23, the zone produced gas as well and across the perforations the Sw Decision Log did show a 2-3 foot interval of uncertain Sw with the K Decision Log showing it has flow capacity. Based on these results the well was completed to 15,100 in order to stay clear of this water productive zone.

As shown in the Decision Logs under the headings Sw and K in FIG. 18-23, the present invention has been demonstrated to determine the degree of certainty in productive and non-productive zones allowing decisions to be made whether to test, stimulate or abandon zones. In addition, this methodology can be used to optimize the wire line log data, if more data is needed, and to suggest future core sampling, if laboratory measured data has significant variation and/or uncertainty.

While the preferred embodiments of the present invention have been shown and described herein, it will be obvious that each such embodiment is provided by way of example only. Numerous variations, changes and substitutions will occur to those skilled in the art without departing from the invention herein. Accordingly, it is intended that the invention be limited only by the spirit and scope of the appended claims.

We claim:

1. A method for developing petrophysical models for use with well log measurement data from a predetermined set of logging tools, wherein said predetermined set includes logging tools for determining water saturation and permeability values in a reservoir, the method comprising:

providing to a processor predetermined error ranges associated with each logging tool in the set;

executing a predetermined software program in said processor to implement Monte Carlo numerical analysis of the predetermined error ranges to determine error distribution data;

executing a predetermined software program in said processor to derive saturation uncertainty modeled values and permeability uncertainty modeled values based on such error distribution data; and executing a predetermined software program in said processor to calibrate the saturation uncertainty modeled values and permeability uncertainty modeled values against data obtained from actual flow tests to develop petrophysical models which, when used with actual logging data, determine whether a location at which such logging measurements were taken is a hydrocarbon productive, non-productive, or undetermined productivity zone, wherein the predetermined set of logging tools further includes tools for determining permeability of the reservoir by providing actual well log measurements to solve the equation (3):

$$K = \left[ \frac{200(\Phi^{4.5})}{Sw^2} \right], \quad (3)$$

where K is the permeability in milliDarcies (md), $\Phi$ is the calculated porosity from the actual well log measurements, and Sw is the water saturation.

2. The method of claim 1, wherein said saturation uncertainty modeled values include predicted saturation values versus resistivity values for a plurality of specified porosity values, along with upper and lower standard deviation limits; and wherein said permeability uncertainty modeled values include predicted permeability values versus resistivity values for a plurality of specified porosity values, along with upper and lower standard deviation limits.

3. The method of claim 2, further comprising the steps of:
using results from the flow tests to determine a water saturation cutoff value which, when correlated with predicted saturation values and associated upper and lower standard deviation limits, define productive, non-productive, and uncertain productivity regions; and
using results from the flow tests to determine a permeability cutoff value which, when correlated with predicted permeability values and associated upper and lower standard deviation limits, define productive, non-productive, and uncertain productivity regions.

4. The method of claim 1, further including the step of providing to the processor information derived from core sampling of the reservoir, and wherein the Monte Carlo numerical analysis includes error information derived from such core sampling.

5. The method as recited in claim 1, further including the step, using the predetermined set of logging for obtaining well logging measurements for a reservoir zone and, using a processor, comparing such measurements with the petrophysical models to determine whether such zone is a hydrocarbon productive, non-productive, or undetermined productivity zone.

6. The method of claim 5, further comprising the steps of obtaining well logging measurements for additional reservoir zones, and determining whether each zone is a hydrocarbon productive, non-productive, or undetermined productivity zone.

7. The method of claim 6, further comprising the step of displaying via a display whether each zone is a hydrocarbon productive, non-productive, or undetermined productivity zone.

8. A system for developing petrophysical models for use with measured data from a predetermined set of logging tools, wherein said predetermined set includes logging tools for determining water saturation and permeability values in a reservoir, the system comprising:
a processor having an input for receiving predetermined error ranges associated with each logging tool in the set; wherein said processor is programmed:
  (i) to execute a predetermined software program to implement Monte Carlo numerical analysis of the predetermined error ranges to determine error distribution data;
  (ii) to derive saturation uncertainty modeled values and permeability uncertainty modeled values based on such error distribution data; and
  (iii) to calibrate the saturation uncertainty modeled values and permeability uncertainty modeled values against data from actual flow test results to develop petrophysical models which, when used with actual logging data, can be used to determine whether a location at which such logging measurements were taken is a hydrocarbon productive, non-productive, or undetermined productivity zone,
wherein the predetermined set of logging tools further includes tools for determining permeability of the reservoir by providing actual well log measurements to solve the equation (3):

$$K = \left[\frac{200(\Phi^{4.5})}{Sw^2}\right], \quad (3)$$

where K is the permeability in milliDarcies (md), $\Phi$ calculated porosity from the actual well log measurements, and Sw is the water saturation.

9. The system of claim 8, wherein said saturation uncertainty modeled values include predicted saturation values versus resistivity values for a plurality of specified porosity values, along with upper and lower standard deviation limits; and wherein said permeability uncertainty modeled values include predicted permeability values versus resistivity values for a plurality of specified porosity values, along with upper and lower standard deviation limits.

10. The system of claim 9, wherein said processor uses results from the flow tests to determine a water saturation cutoff value which, when correlated with predicted saturation values and associated upper and lower standard deviation limits, define productive, non-productive, and uncertain productivity regions; and wherein said processor uses results from the flow tests to determine a permeability cutoff value which, when correlated with predicted permeability values and associated upper and lower standard deviation limits, define productive, non-productive, and uncertain productivity regions.

11. The system of claim 8, further including the step of providing to the processor information derived from core sampling of the reservoir, and wherein the Monte Carlo numerical analysis includes error information derived from such core sampling.

12. The system of claim 8, wherein the predetermined set of logging tools for determining water saturation of the reservoir include tools for providing well log measurements to solve the equation (2):

$$Sw = \left[\frac{R_w}{\Phi^m R_t}\right]^{1/n}, \quad (2)$$

where Sw is the water saturation, $R_w$ is a resistivity of connate formation water, $\Phi$ is the computed porosity from the actual well log measurements, $R_t$ is a measured formation resistivity from the actual well log measurements, n is the saturation exponent, and m is a cementation exponent.

13. The system of claim 12, wherein the predetermined set of logging tools further includes tools for determining porosity of the reservoir from actual well log measurements to solve the equation (1):

$$\Phi = \frac{\rho_{ma} - \rho_b}{\rho_{ma} - \rho_{fluid}}, \quad (1)$$

where $\Phi$ is the formation porosity, $\rho_{ma}$ is the bulk matrix density of the rock, $\rho_b$ the bulk density measured by the density tool, and $\rho_{fluid}$ is the fluid density within the pore space.

14. The system of claim 12, wherein $\Phi$ is about 0.25, $R_w$ is about 0.012 ohm-meter, $R_t$ is about 2 ohm-meter, m is about 2, and n is about 1.6.

15. The system of claim 8, wherein the predetermined set of logging tools further includes tools for determining poros ity of the reservoir from actual well log measurements to solve the equation (1):

$$\Phi = \frac{\rho_{ma} - \rho_b}{\rho_{ma} - \rho_{fluid}}, \quad (1)$$

where $\Phi$ is the formation porosity, $\rho_{ma}$ is the bulk matrix density of the rock, $\rho_b$, the bulk density measured by the density tool, and $\rho_{fluid}$ is the fluid density within the pore space.

* * * * *